(12) United States Patent
Meyer et al.

(10) Patent No.: US 8,456,238 B1
(45) Date of Patent: Jun. 4, 2013

(54) TAPERED ATTENUATOR NETWORK FOR MITIGATING EFFECTS OF DIRECT CURRENT (DC) BIAS INDUCTOR SELF-RESONANCE IN TRAVELING WAVE AMPLIFIERS

(75) Inventors: Jeffrey W. Meyer, Santa Rosa, CA (US); Jerry Orr, Santa Rosa, CA (US)

(73) Assignee: Centellax, Inc., Santa Rosa, CA (US)

( * ) Notice: Subject to any disclaimer, the term of this patent is extended or adjusted under 35 U.S.C. 154(b) by 0 days.

(21) Appl. No.: 13/436,802

(22) Filed: Mar. 30, 2012

(51) Int. Cl.
*H03F 3/60* (2006.01)

(52) U.S. Cl.
USPC .......................................... 330/286; 330/295

(58) Field of Classification Search
USPC .......................... 330/286, 295, 124 R, 53–54
See application file for complete search history.

(56) References Cited

U.S. PATENT DOCUMENTS

| | | | |
|---|---|---|---|
| 5,105,172 | A | 4/1992 | Khatibzadeh et al. |
| 6,674,329 | B1 * | 1/2004 | Stengel et al. ................ 330/286 |
| 6,788,148 | B2 | 9/2004 | Orr et al. |
| 7,345,539 | B2 | 3/2008 | Tayrani et al. |
| 2009/0243717 | A1 | 10/2009 | Bonthron |

FOREIGN PATENT DOCUMENTS

JP 11-015043 1/1999

OTHER PUBLICATIONS

Fujii et al., "Constant Linearity Variable Gain Traveling Wave Amplifier MMIC for 1 to 26.5 GHz Applications," Proceedings of the 36th European Microwave Conference, pp. 1747-1750 (Sep. 10-15, 2006).

"Measuring Self Resonant Frequency," Document 363-1, Coilcraft, pp. 1-3 (Sep. 16, 2003).
Kaman et al., "A 100-kHz to 50-GHz Traveling-Wave Amplifier IC Module," IEEE Microwave and Guided Wave Letters, vol. 9, No. 10, pp. 1-3 (Oct. 1999).
Rosu, "Bias Circuits for RF Devices," pp. 1-18 (Publication Date Unknown).
Statement of Inventor Regarding Priot Traveling Wave Amplifier Design (Dec. 5, 2012).
"Application Note 5359," AMMC-5024 30 kHz-40GHz TWA Operational Guide, Avago Technologies, pp. 1-8 (Oct. 26, 2010).
Notification of Transmittal of the International Search Report and the Written Opinion of the International Searching Authority, or the Declaration for International Application No. PCT/US2012/044247 (Jan. 10, 2013).
Song et al., "Theory and experiment of a 94 GHz gyrotron traveling-wave amplifier," Phyiscs of Plasmas, vol. 11, No. 5, pp. 2935-2941 (May 2004).
Park et al., "Gain Broadening of Two-Stage Tapered Gyrotron Traveling Wave Tube Amplifiers," Physical Review Letters, vol. 74, No. 12, pp. 2399-2402 (Mar. 20, 1995).

* cited by examiner

*Primary Examiner* — Hieu Nguyen
(74) *Attorney, Agent, or Firm* — Jenkins, Wilson, Taylor & Hunt, P.A.

(57) ABSTRACT

A traveling wave amplifier includes a tapered attenuator network for mitigating the effects of DC bias inductor self-resonance. The amplifier includes a gain stages connected in a ladder network for successively amplifying a forward traveling wave caused by an input signal to produce an output signal. A back termination is coupled to the gain stages to absorb backwards traveling waves created by reflections from the gain stages and an output of the amplifier. An inductive DC bias circuit is coupled to the gain stages near the back termination for providing DC bias to the gain stages. A tapered multi-section frequency selective attenuator network is connected between the DC bias circuit and a first one of the gain stages for reducing the effect of self-resonance of the inductive DC bias circuit on the output signal.

10 Claims, 8 Drawing Sheets

TAPERED ATTENUATOR NETWORK FOR MITIGATING EFFECTS OF DIRECT CURRENT (DC) BIAS INDUCTOR SELF-RESONANCE IN TRAVELING WAVE AMPLIFIERS

TECHNICAL FIELD

The subject matter described herein relates to traveling wave amplifiers. More particularly, the subject matter described herein relates to a tapered attenuator network for mitigating effects of DC bias inductor self-resonance in traveling wave amplifiers.

BACKGROUND

Broadband amplifiers require a DC bias that will operate effectively over their entire operational frequency ranges. Some broadband amplifiers, such as traveling wave amplifiers that are used in telecommunications switching networks, need to operate from the kilohertz range to the tens or hundreds of gigahertz range. Some broadband amplifiers use bias resistors and current sources to provide DC bias to the amplifiers. One problem with using bias resistors and current sources is that the current traveling through the resistors results in resistive power loss proportional to the square of the current and the resistance of the resistor, reducing the power efficiency of the amplifiers.

Because power efficiency is a key design constraint of broadband amplifiers, DC bias circuits that utilize resistor and current source designs are not optimal. The highest efficiency broadband amplifiers use inductor based bias chokes. An inductor based bias choke consists of a voltage source and an inductor. Ideally, the inductor should appear as a short circuit to direct current to allow the DC bias current to reach the amplifier without high resistive losses. The inductor should appear as a very high impedance to alternating current (AC) signals over the operational frequency range of the amplifier so that the impedance of the inductor does not adversely affect the operation of the amplifier. For example, capacitance between the windings of an inductor causes the inductor to self-resonate at its self-resonant frequency. If the self-resonant frequency of the DC bias inductor is within the operational frequency range of the amplifier, the DC bias circuit will appear as a short circuit to ground at the resonant frequency. A short to ground in the DC bias circuit of a broadband amplifier changes the impedance seen looking into the output terminals of the amplifier and adversely affects its operation.

One type of inductor bias choke that operates over wide frequency range requires large, expensive, conical wound ferrite core in order to present a large inductive impedance with reduced self-resonance caused by parasitic capacitance of the windings. Requiring conical wound ferrite core inductors to present the proper impedance increases the cost of broadband amplifiers.

Accordingly, there exists a need for a broadband amplifier with a tapered attenuation network for mitigating the effects of bias inductor self-resonance.

SUMMARY

The subject matter described herein includes a traveling wave amplifier having a tapered attenuator network for mitigating the effects of DC bias inductor self-resonance. One exemplary amplifier includes a plurality of gain stages connected in a ladder network for successively amplifying a forward traveling wave caused by an input signal to produce an output signal. The amplifier further includes a back termination coupled to the gain stages to absorb backwards traveling waves created by reflections from the gain stages and an output of the amplifier. The amplifier further includes an inductive DC bias circuit coupled between the gain stages and the back termination for providing DC bias to the gain stages. The amplifier further includes a tapered multi-section frequency selective attenuator network connected between the DC bias circuit and a first one of the gain stages for reducing the effect of self-resonance of the inductive DC bias circuit on the output signal.

BRIEF DESCRIPTION OF THE DRAWINGS

The subject matter described herein will now be explained with reference to the accompanying drawings of which.

DETAILED DESCRIPTION

Figure 1:
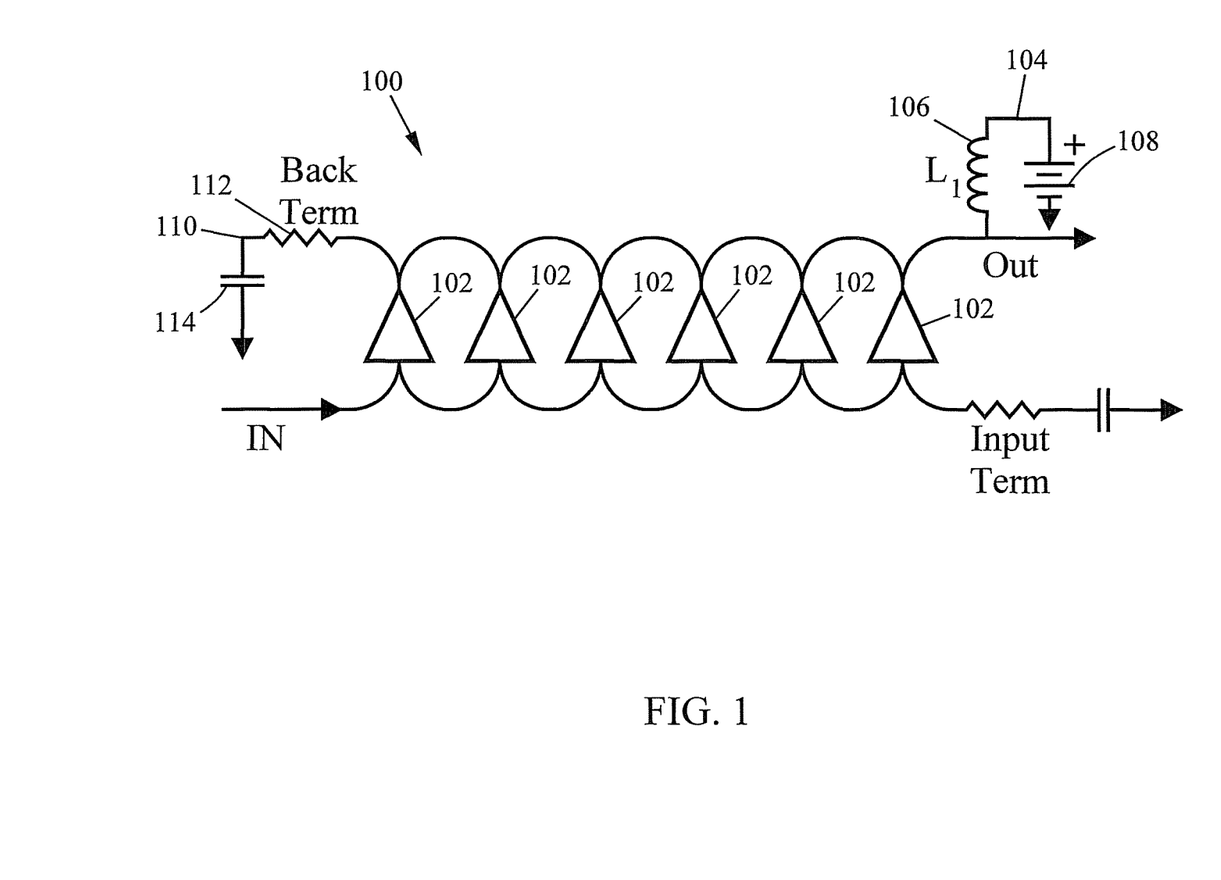
FIG. 1 is a diagram illustrating an exemplary topology of a six stage traveling wave amplifier with an inductor based DC bias circuit at the output terminal of the amplifier.

The subject matter described herein includes a traveling wave amplifier with a tapered multi-section attenuator network for mitigating the effects of DC bias inductor self-resonance. FIG. 1 is a diagram illustrating an exemplary traveling wave amplifier with an inductor based DC bias circuit located at the output terminal of the amplifier. In FIG. 1, amplifier 100 includes a plurality of gain stages 102 connected in a ladder network. Each gain stage 102 may be a single transistor amplifier, such as a single MOSFET amplifier. In an alternate implementation, each gain stage 102 may include plural transistors. In the illustrated example, amplifier 100 includes an inductive DC bias circuit 104 located at the output terminal. Bias circuit 104 includes an inductor 106 and a DC voltage source 108. Bias circuit 104 provides DC bias to the transistors that make up gain stages 102. Amplifier 100 also includes a back termination 110 to absorb reflections from gain stages 102 and from the output terminal of the amplifier. Back termination 110 includes a resistance 112 and a capacitor 114.

In operation, amplifier 100 receives an input signal at the first of the gain stages 102, and a forward traveling wave generated by the input signal is amplified at each successive gain stage to produce an amplified output voltage at the output terminal. Reflected waves are absorbed by back termination 110.

Figure 2:
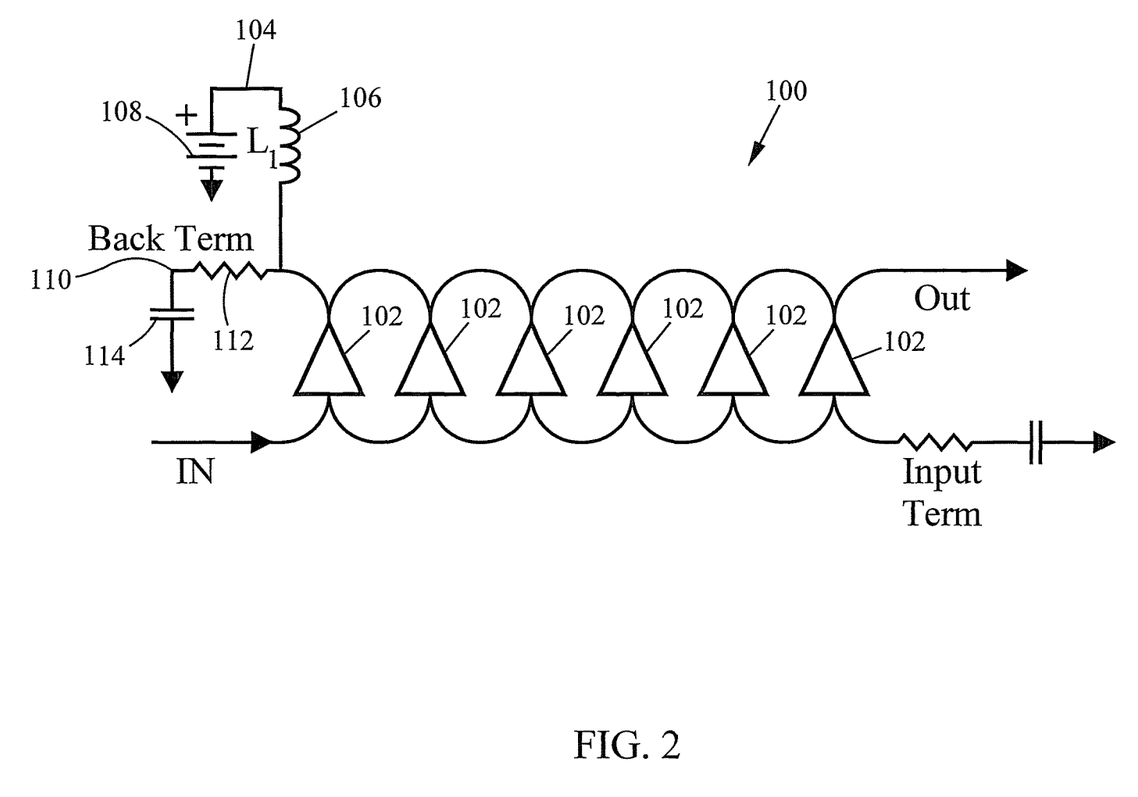
FIG. 2 is a diagram of a traveling wave amplifier with a back termination and an inductor based DC bias circuit at the back termination suitable for use with embodiments of the subject matter described herein.

An improvement on the design illustrated in FIG. 1 is shown in FIG. 2, where inductive DC bias circuit 104 is located at the back termination. Locating inductive DC bias circuit 104 at back termination 110 allows the effects of self-resonance of inductor 106 to be masked by the transmission line characteristics of the lines between inductive DC bias circuit 104 and the output terminal. However, even this design has conventionally been implemented using a high inductance conical wound inductor to operate over desired frequency ranges. As stated above, using such inductors is undesirable as they increase the cost of the amplifier.

Figure 3:
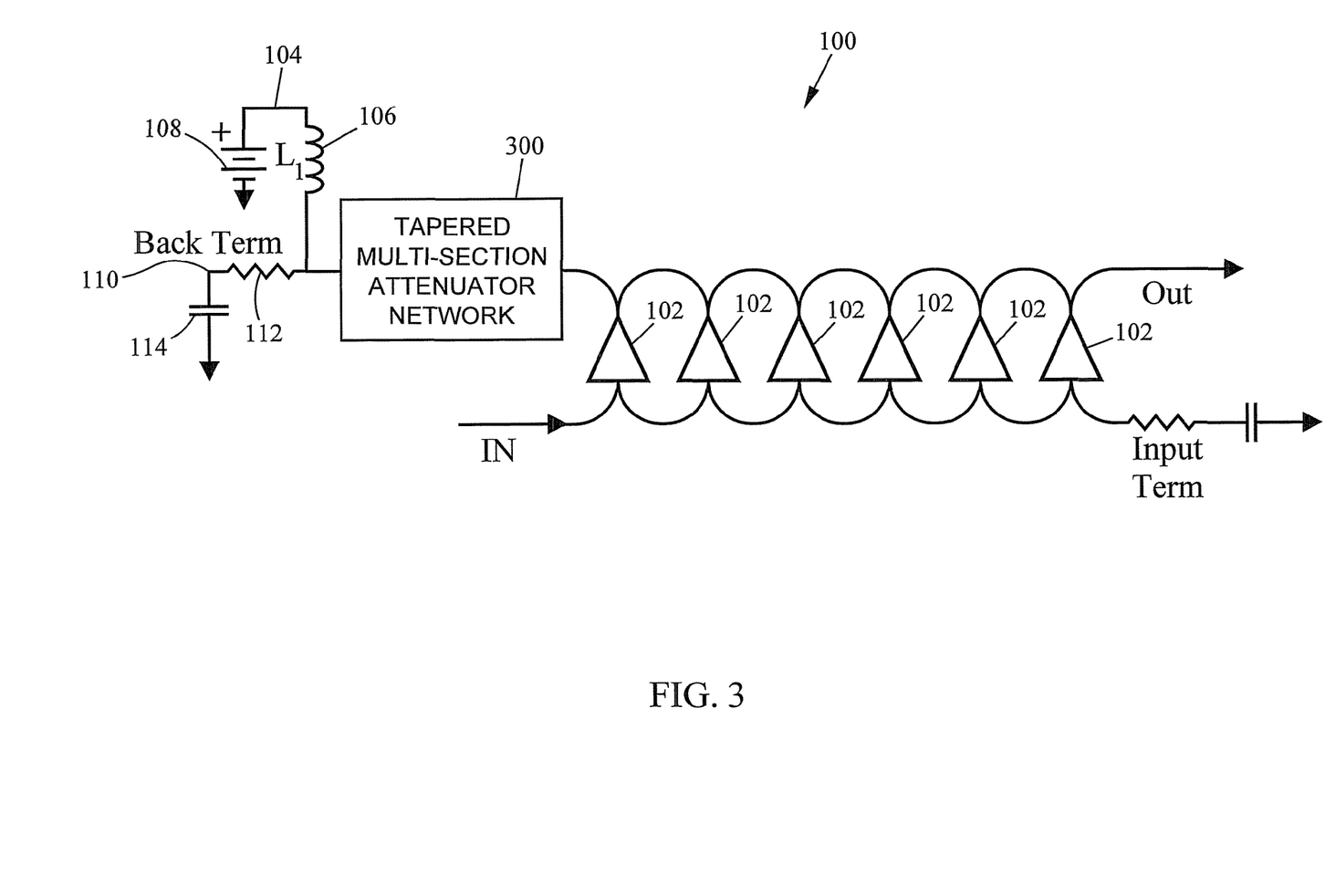
FIG. 3 is a diagram of a traveling wave amplifier with a back termination, an inductor-based DC bias circuit at the back termination and a tapered multi-section attenuator network according to an embodiment of the subject matter described herein.

In order to allow inexpensive off-chip inductors to be used in DC bias circuits, a traveling wave amplifier according to an embodiment of the subject matter described herein may include an on-chip (i.e., implemented on the same chip as the remaining components of traveling wave amplifier 100 other than DC bias circuit 104) multi-section tapered attenuator network located between the first gain stage 102 and back termination 110. FIG. 3 is a diagram illustrating an exemplary traveling wave amplifier with a tapered multi-section tapered attenuator network according to an embodiment of the subject matter described herein. In FIG. 3, inductive DC bias circuit 104 is located at the back termination 110, as illustrated in FIG. 2. In order to mask the effects of self-resonance caused by inductor 106, a tapered multi-section attenuator network 300 is coupled between DC bias circuit 106 and gain stages 102. The tapered attenuator network 300 may include successive sections of different inductance, each of which masks or mitigates the self-resonance of the previous section. For example, inductances that are closer to DC bias circuit 104 may be larger than inductances of stages in tapered attenuator network 300 that are further from DC bias circuit 104. Thus, the sections of multi-section tapered attenuator network 300 may mimic the design of an inductor that is made of a tapered conical would ferrite core oriented such that the larger coils are nearer to inductor 106.

Figure 4:
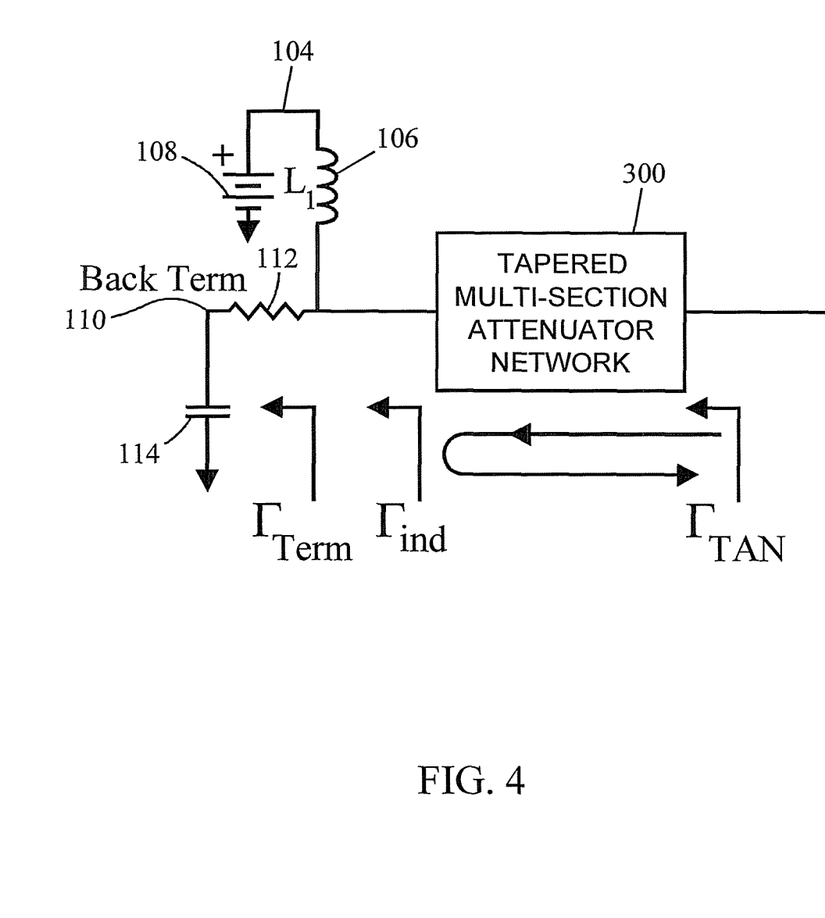
FIG. 4 is a diagram illustrating a tapered multi-section attenuator network, an inductor based DC bias circuit, and a back termination of a traveling wave amplifier according to an embodiment of the subject matter described herein.

FIG. 4 is a diagram illustrating the improvement in impedance match in the traveling wave amplifier caused by tapered multi-section attenuator network 300. In FIG. 4, $\Gamma_{term}$ is the impedance seen looking into the back termination, $\Gamma_{ind}$ is the impedance seen looking into the combination of inductor 106 and the back termination, and $\Gamma_{TAN}$ is impedance seen looking into tapered multi-section attenuator network 300. Tapered multi-section attenuator network 300 preferably passes DC current from DC voltage source 108 with low loss. Tapered multi-section attenuator network 300 must also have an impedance over the operational frequency range of amplifier 100. The impedance should be similar to that of back termination 110. The reflected wave looking into tapered multi-section attenuator network 300 must pass through the network 300 twice, as indicated by the u-shaped arrow in FIG. 4. Accordingly, the reflected wave has its magnitude attenuated by the square of the attenuation as shown by Equation 1 below.

$$\Gamma_{TAN} = (S21_{TAN})^2 * \Gamma_{ind} \tag{1}$$

Figure 5A:
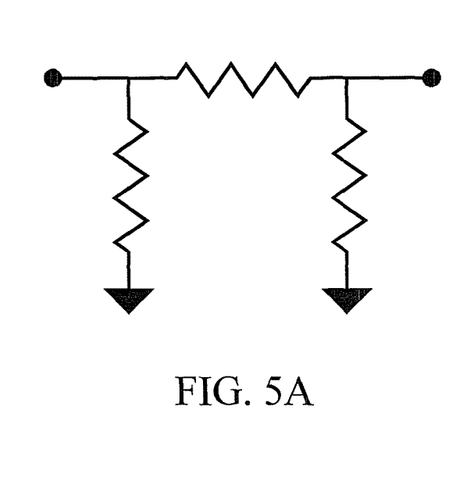
FIG. 5A is a diagram illustrating a Pi attenuator design.
Figure 5B:
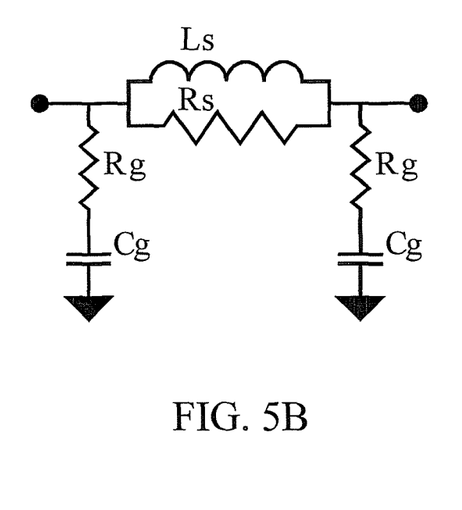
FIG. 5B is a diagram of a section of a tapered multi-section attenuator network that uses the Pi design according to an embodiment of the subject matter described herein.

In one embodiment, the construction of tapered multi-section attenuator network 300 may be similar to that of a Pi attenuator as illustrated in FIGS. 5A and 5B. In Equation 1, S21 is the magnitude of the impedance of tapered multistage attenuator network 300. As illustrated in FIG. 5B, in order to be frequency selective, the Pi attenuator may have a series inductance $L_S$ and series resistance $R_S$ that are connected in a Pi configuration with first and second sets of a shunt capacitance $C_g$ and a shunt resistance $R_g$. Equations 2 and 3 shown below illustrate the impedance of the Pi attenuator.

$$|S21| = (R_G - Z_0)/(R_G + Z_0) \tag{2}$$

$$R_S = 4 * R_G * Z_0 / ((Z_0 - R_G) * (Z_0 + R_G)) \tag{3}$$

In Equations 2 and 3, $Z_0$ is the characteristic impedance of the transmission line. The impedance match can still be mathematically perfect for a frequency selective attenuator if the condition set forth in Equation 4 shown below is met.

$$R_S/L_S = 1/(R_G * C_G) \tag{4}$$

Figure 6A:
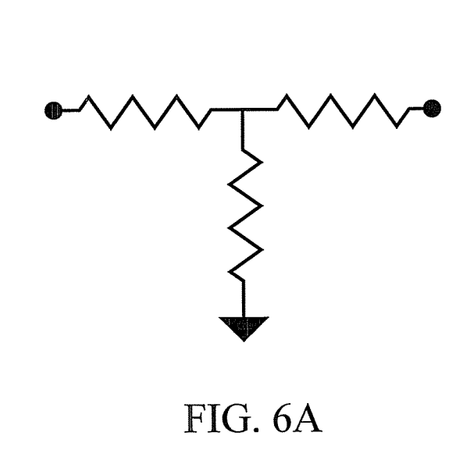
FIG. 6A is a diagram illustrating a Tee attenuator design.
Figure 6B:
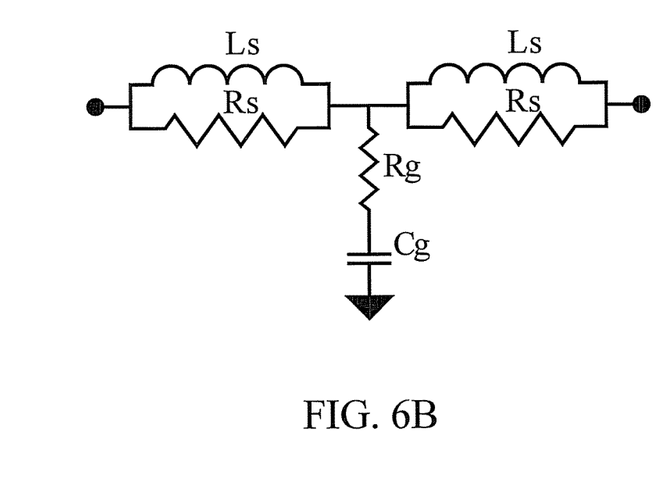
FIG. 6B is a diagram of a section of a tapered multi-section attenuator network that incorporates a Tee design according to an embodiment of the subject matter described herein.

The subject matter described herein is not limited to using Pi attenuators for each section of tapered multi-section attenuator network 300. In an alternate implementation, a Tee design may be used from each section. FIG. 6A illustrates an exemplary resistive Tee attenuator, and FIG. 6B illustrates exemplary frequency selective Tee attenuator suitable for use as a section in tapered multi-section attenuator network according to an embodiment of the subject matter described herein. Referring to FIG. 6B, each section of the Tee attenuator includes a series inductances $L_S$ and a series resistance $R_S$ connected in a Tee configuration with a shunt capacitance $C_g$ and a shunt resistance $R_g$.

Figure 7:
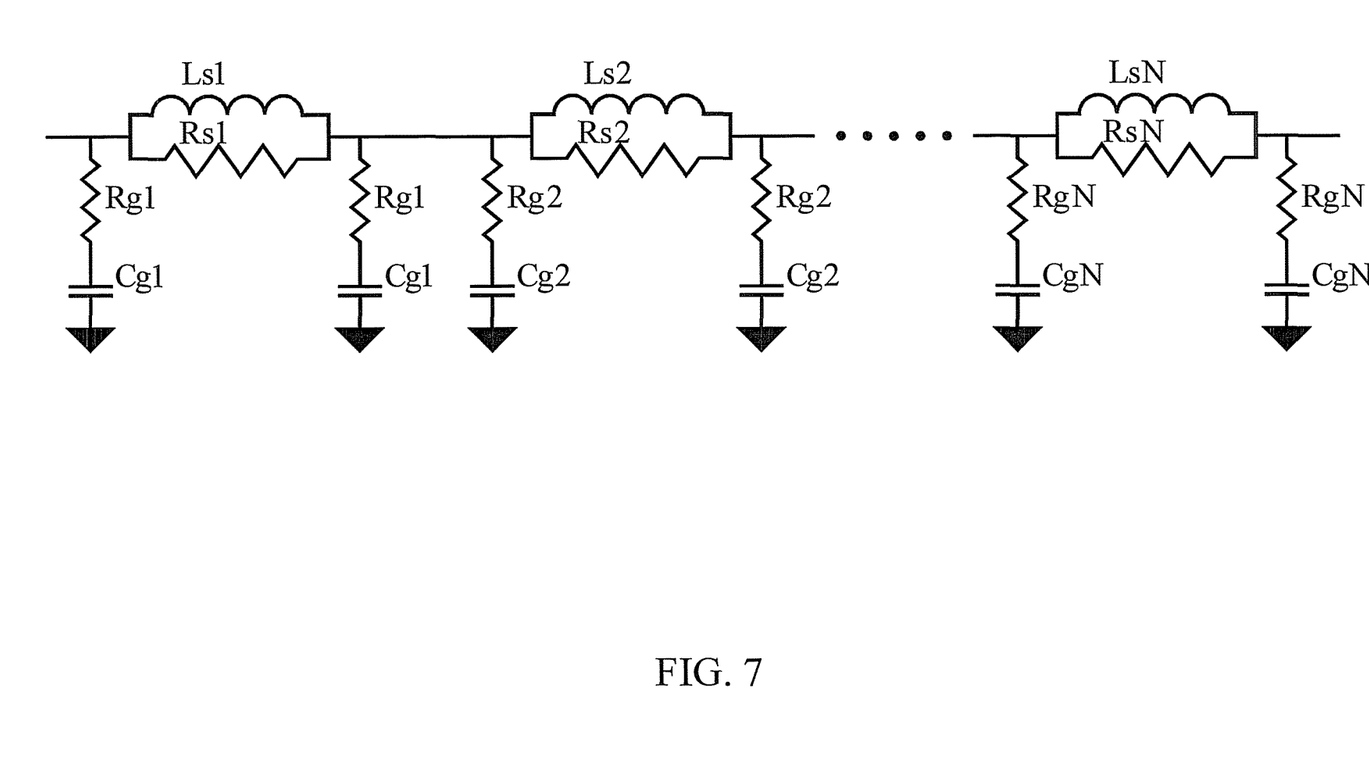
FIG. 7 is a diagram illustrating a tapered multi-section frequency selective attenuator network where each section incorporates a Pi design according to an embodiment of the subject matter described herein.

FIG. 7 illustrates a tapered multi-section frequency selective attenuator based on the Pi design according to an embodiment of the subject matter described herein. In FIG. 7, the inductance of stage 1 may be greater than the inductance of stage 2 and so forth, such that the inductance of stage N is greater than the inductance of stage N+1, where N is an integer and where lower values of N are closer to the DC bias inductor. Tapering the attenuator as illustrated in FIG. 7, mimics the design of a conical wound ferrite. Each stage masks the self-resonance of the previous stage.

Figure 8:
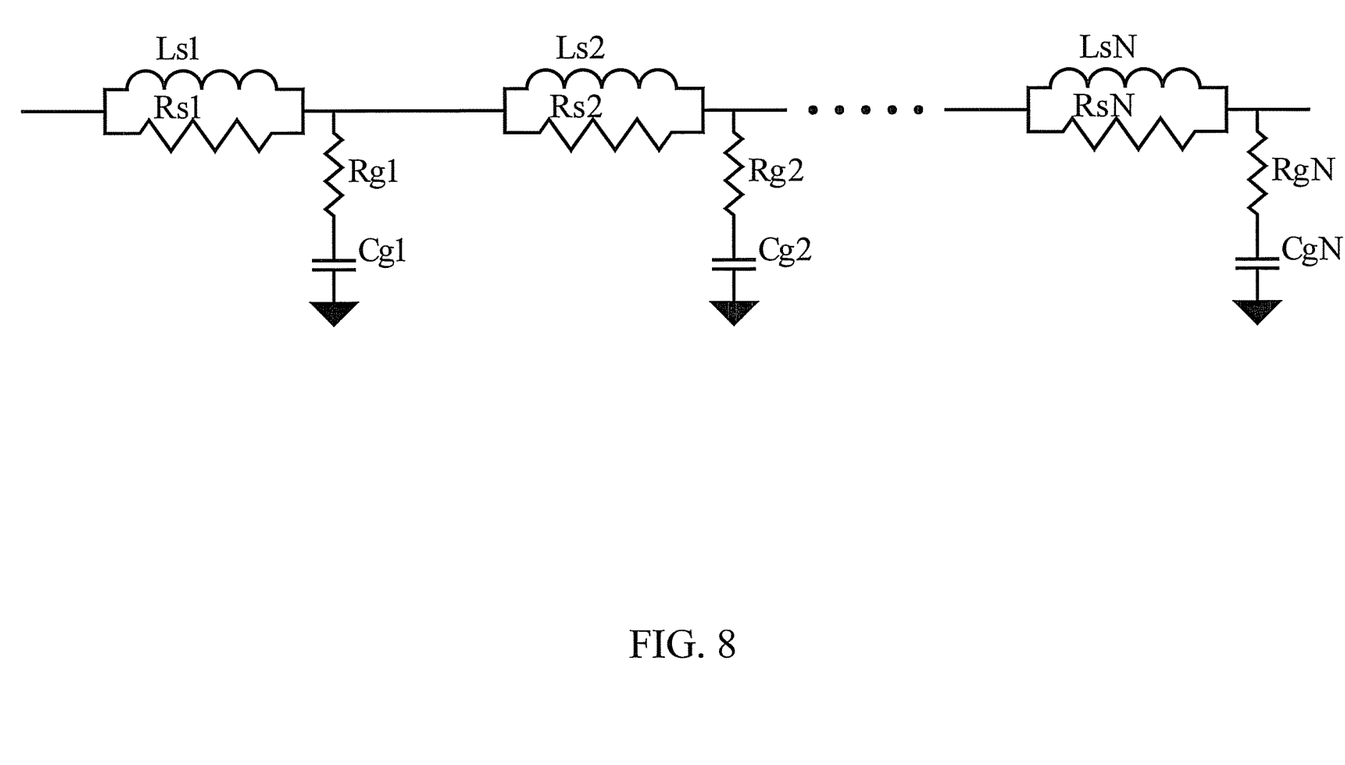
FIG. 8 is a diagram of a tapered multi-section frequency selective attenuator network where each section incorporates a Tee design according to an embodiment of the subject matter described herein.

FIG. 8 illustrates an exemplary tapered multi-section attenuator network where each section is based on the Tee design according to an embodiment of the subject matter described herein. In FIG. 8, the inductance of the $N^{th}$ stage may be greater than the inductance of stage N+1, where lower values of N are positioned closer to the DC bias inductor.

As set forth above, using a tapered multi-section attenuator network, the subject matter described herein allows inductors of low quality, i.e., those that may have parasitic capacitance within the operational frequency range of the amplifier, to be used in DC bias circuits. In addition, tapered multi-section attenuator network 300 may be made entirely of passive components, i.e., resistors, inductors, and capacitors. However, using active elements in combination with the passive elements described above or using active elements that mimic the behavior of the passive elements described above are both intended to be within the scope of embodiments of the subject matter described herein.

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A traveling wave amplifier having a tapered attenuator network for mitigating the effects of direct current (DC) bias inductor self-resonance, the traveling wave amplifier comprising:
- a plurality of gain stages connected in a ladder network for successively amplifying a forward traveling wave caused by an input signal to produce an output signal;
- a back termination coupled to the gain stages to absorb backwards traveling waves created by reflections from the gain stages and an output of the amplifier;
- an inductive direct current (DC) bias circuit coupled to the gain stages near the back termination for providing DC bias to the gain stages; and
- a tapered multi-section frequency selective attenuator network connected between the inductive DC bias current and a first one of the gain stages for reducing the effect of self-resonance of the inductive DC bias circuit on the output signal.

2. The amplifier of claim 1 wherein the tapered multi-section frequency selective attenuator network includes N sections, N being an integer of at least 2, the Nth section being closer to the inductive DC bias circuit than the N+1th section and the Nth section having a greater inductance than the N+1th section.

3. The amplifier of claim 1 wherein each section of the tapered multi-section frequency selective attenuator network includes a series resistance and a series inductance connected in a Pi configuration with a first shunt resistance and a first shunt capacitance and a second shunt resistance and a second shunt capacitance.

4. The amplifier of claim 1 wherein each section of the tapered multi-section frequency selective attenuator network includes a series resistance and a series inductance connected in a Tee configuration with a shunt resistance and a shunt capacitance.

5. The amplifier of claim 1 wherein the tapered multi-section frequency selective attenuator network is formed entirely of passive components.

6. A tapered multi-section attenuator network for reducing the effects of self-resonance of an inductor-based direct current (DC) bias circuit, the network comprising:
- N attenuator sections, N being an integer of at least two, the Nth section being connected to the (N+1)th section, each of the N sections including a series resistance, a series inductance, a first shunt resistance, and a first shunt capacitance;
- wherein a first of the N attenuator sections is configured to connect to an inductor based DC bias circuit and a last of the N attenuator sections is configured to connect to a gain stage of a traveling wave amplifier; and
- wherein an inductance of each Nth section is greater than an inductance of each (N+1)th section.

7. The attenuator network of claim 6 wherein the series resistance the series inductance of each section are connected in a Pi configuration with the first shunt resistance and the first shunt capacitance and a second shunt resistance and a second shunt capacitance.

8. The attenuator network of claim 6 wherein the series inductance and the series resistance of each section are connected to the first shunt resistance and the first shunt capacitance in a Tee configuration.

9. The attenuator network of claim 6 wherein each of the attenuator sections comprises only passive circuit elements.

10. The attenuator network of claim 6 comprising a chip, wherein each of the N sections is an on-chip component.

* * * * *